United States Patent
Xu et al.

(10) Patent No.: US 10,790,271 B2
(45) Date of Patent: Sep. 29, 2020

(54) PERPENDICULAR STACKED FIELD-EFFECT TRANSISTOR DEVICE

(71) Applicant: International Business Machines Corporation, Armonk, NY (US)

(72) Inventors: Zheng Xu, Wappingers Falls, NY (US); Chen Zhang, Guilderland, NY (US); Ruqiang Bao, Niskayuna, NY (US); Dongbing Shao, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/954,819

(22) Filed: Apr. 17, 2018

(65) Prior Publication Data

US 2019/0319021 A1 Oct. 17, 2019

(51) Int. Cl.
  *H01L 21/84* (2006.01)
  *H01L 25/00* (2006.01)
  (Continued)

(52) U.S. Cl.
  CPC ........ *H01L 25/50* (2013.01); *H01L 21/76251* (2013.01); *H01L 24/83* (2013.01);
  (Continued)

(58) Field of Classification Search
  CPC ... H01L 25/0657; H01L 25/074; H01L 24/17; H01L 24/14; H01L 24/73; H01L 24/92;
  (Continued)

(56) References Cited

U.S. PATENT DOCUMENTS 5,355,022 A * 10/1994 Sugahara ............ H01L 21/2007
  257/768
5,612,552 A * 3/1997 Owens ................ H01L 27/0688
  257/202
(Continued)

FOREIGN PATENT DOCUMENTS

WO WO-2018038403 A1 * 3/2018 .......... H01L 27/3211

OTHER PUBLICATIONS

P. McLellan, "Moving Logic to the 3rd Dimension," Cadence Breakfast Bytes Blogs, https://community.cadence.com/cadence_blogs_8/b/breakfast-bytes/posts/moving-logic-to-the-3rd-dimension, Aug. 9, 2017, 4 pages.

(Continued)

*Primary Examiner* — Vincent Wall
(74) *Attorney, Agent, or Firm* — Vazken Alexanian; Ryan, Mason & Lewis, LLP (57) ABSTRACT

A method for manufacturing a semiconductor device includes forming a first field-effect transistor (FET) on a substrate, the first FET comprising a first plurality of channel regions extending in a first direction, and stacking a second FET on the first FET, the second FET comprising a second plurality of channel regions extending in a second direction perpendicular to the first direction, wherein the first FET comprises a first gate region extending in the second direction across the first plurality of channel regions, and the second FET comprises a second gate region extending in the first direction across the second plurality of channel regions.

18 Claims, 6 Drawing Sheets

(51) Int. Cl.
    *H01L 21/762* (2006.01)
    *H01L 25/07* (2006.01)
    *H01L 23/00* (2006.01)
    *H01L 29/78* (2006.01)

(52) U.S. Cl.
    CPC ............ *H01L 25/074* (2013.01); *H01L 24/32* (2013.01); *H01L 29/7853* (2013.01); *H01L 2224/32145* (2013.01); *H01L 2224/83896* (2013.01)

(58) Field of Classification Search
    CPC ............... H01L 21/563; H01L 23/3128; H01L 27/0207; H01L 21/823412; H01L 29/785; H01L 25/50; H01L 2221/68363; H01L 2225/06562
    See application file for complete search history.

(56) References Cited

U.S. PATENT DOCUMENTS

| | | | | |
|---|---|---|---|---|
| 6,201,267 | B1* | 3/2001 | Gupta | H01L 27/092 257/206 |
| 6,943,067 | B2* | 9/2005 | Greenlaw | H01L 21/743 257/E21.538 |
| 7,560,336 | B2* | 7/2009 | Abbott | H01L 27/10876 438/239 |
| 7,804,137 | B2* | 9/2010 | Kang | H01L 21/8221 257/369 |
| 7,960,242 | B2* | 6/2011 | Or-Bach | G11C 17/14 257/E21.023 |
| 8,058,137 | B1* | 11/2011 | Or-Bach | H03K 17/687 257/E21.023 |
| 8,331,094 | B2* | 12/2012 | Ankireddi | H01L 23/367 165/185 |
| 8,405,154 | B2* | 3/2013 | Benaissa | H01L 21/26586 257/368 |
| 9,177,890 | B2* | 11/2015 | Du | H01L 23/48 |
| 9,202,788 | B2* | 12/2015 | Okuno | G03F 9/708 |
| 9,659,963 | B2* | 5/2017 | Cheng | H01L 27/1211 |
| 2004/0262635 | A1* | 12/2004 | Lee | B82Y 10/00 257/199 |
| 2005/0280061 | A1* | 12/2005 | Lee | H01L 21/2007 257/296 |
| 2006/0261406 | A1* | 11/2006 | Chen | H01L 21/82382 257/329 |
| 2007/0001219 | A1* | 1/2007 | Radosavljevic | H01L 29/41791 257/327 |
| 2008/0128796 | A1* | 6/2008 | Zhu | H01L 21/845 257/328 |
| 2008/0179728 | A1* | 7/2008 | Ikeda | H01L 27/0688 257/686 |
| 2009/0108318 | A1* | 4/2009 | Yoon | H01L 21/8221 257/306 |
| 2009/0170259 | A1* | 7/2009 | Hornung | H01L 21/26586 438/231 |
| 2009/0236658 | A1* | 9/2009 | Gruening-von Schwerin | H01L 21/26586 257/331 |
| 2009/0267233 | A1* | 10/2009 | Lee | H01L 21/2007 257/758 |
| 2010/0038625 | A1* | 2/2010 | Bertin | B82Y 10/00 257/9 |
| 2011/0002159 | A1* | 1/2011 | Suzuki | G11C 7/02 365/149 |
| 2012/0248544 | A1* | 10/2012 | Yokoyama | H01L 29/045 257/369 |
| 2013/0056810 | A1* | 3/2013 | Sudo | G11C 11/1659 257/295 |
| 2014/0175366 | A1* | 6/2014 | Tu | H01L 45/1253 257/4 |
| 2015/0333056 | A1* | 11/2015 | Du | H01L 23/528 257/773 |
| 2016/0043074 | A1* | 2/2016 | Hurley | H01L 21/8258 257/351 |
| 2016/0197069 | A1* | 7/2016 | Morrow | H01L 21/82343 257/393 |
| 2016/0268375 | A1* | 9/2016 | Chen | H01L 29/78684 |
| 2017/0025412 | A1* | 1/2017 | Jun | H01L 21/82348 |
| 2017/0162702 | A1* | 6/2017 | Hu | H01L 29/78391 |
| 2018/0240797 | A1* | 8/2018 | Yokoyama | H01L 25/065 |

OTHER PUBLICATIONS

Mark Lapedus, "What's After FinFETs?," Semiconductor Engineering, Jul. 24, 2017, 17 pages.

* cited by examiner

PERPENDICULAR STACKED FIELD-EFFECT TRANSISTOR DEVICE

TECHNICAL FIELD

The field generally relates to semiconductor devices and methods of manufacturing same and, in particular, to a stacked field-effect transistor (FET) device including stacked FETS oriented perpendicularly with respect to each other.

BACKGROUND

A complementary field-effect transistor (CFET) includes a p-type field-effect transistor (PFET) vertically stacked on top of an n-type field-effect transistor (NFET) or vice versa. A CFET can utilize gate-all-around technology when stacking NFET and PFET wires on top of each other. Stacking can permit smaller scale devices, but can also be problematic when there are too many overlapping areas, such as fins and source/drain regions, causing unwanted high capacitance.

Accordingly, there is a need for improved methods and structures for stacking FET devices, which result in reduced capacitance.

SUMMARY

According to an exemplary embodiment of the present invention, a method for manufacturing a semiconductor device includes forming a first field-effect transistor (FET) on a substrate, and stacking a second FET on the first FET, wherein the first FET is oriented at an angle of ±90 degrees with respect to the second FET.

According to an exemplary embodiment of the present invention, a semiconductor device includes a first field-effect transistor (FET) on a substrate, and a second FET stacked on the first FET, wherein the first FET is oriented at an angle of ±90 degrees with respect to the second FET, and wherein the angle is measured with respect to an axis extending along a direction of the stacking.

According to an exemplary embodiment of the present invention, a method for manufacturing a semiconductor device includes forming a first field-effect transistor (FET) on a substrate, the first FET comprising a first plurality of channel regions extending in a first direction, and stacking a second FET on the first FET, the second FET comprising a second plurality of channel regions extending in a second direction perpendicular to the first direction, wherein the first FET comprises a first gate region extending in the second direction across the first plurality of channel regions, and the second FET comprises a second gate region extending in the first direction across the second plurality of channel regions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to stacked complementary FET (CFET) devices that reduce capacitance by orienting the stacked FETs differently from each other.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), stacked FET, nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, stacked FETs, FinFETs, nanowire FETs, nanosheet FETs, vertical FETs, SETs, CMOSs and/or MOSFETs. By way of non-limiting example, the semiconductor devices can include, but are not necessarily limited to FET, stacked FET, FinFET, nanowire FET, nanosheet FET, vertical FET, SET, CMOS and MOSFET devices, and/or semiconductor devices that use FET, stacked FET, FinFET, nanowire FET, nanosheet FET, vertical FET, SET CMOS and/or MOSFET technology.

As used herein, "height" refers to a vertical size of an element (e.g., a layer, trench, hole, opening, etc.) in the cross-sectional or three-dimensional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional or three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate and/or up and down directions in the cross-sectional and top views, and "horizontal" refers to a direction parallel to the top surface of the substrate and/or left and right directions in the cross-sectional views and top views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FinFET devices include a transistor architecture that uses raised source-to-drain channel regions, referred to as fins. A FinFET device can be built on a semiconductor substrate, where a semiconductor material, such as Si and/or SiGe, is patterned into fin-like shapes and functions as the channels of the transistors. Some FinFET devices include fins with source/drain regions on lateral sides of the fins, so that current flows in a horizontal direction (e.g., parallel to a substrate) between source/drain regions at opposite ends of the fins in the horizontal direction. While embodiments of the present invention are described in connection with gate structures formed on and around fins of FinFET devices, the embodiments of the present invention are also applicable to other devices, including, but not necessarily limited to, nanowire FET and nanosheet FET devices.

Figure 1A:
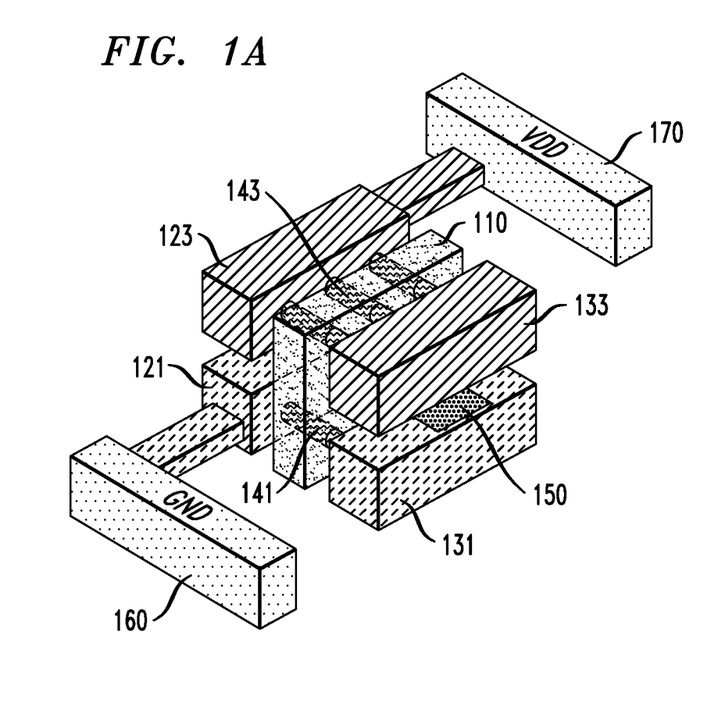
FIG. 1A is a three-dimensional view and FIG. 1B is a top view illustrating a stacked field-effect transistor (FET) device.
Figure 1B:
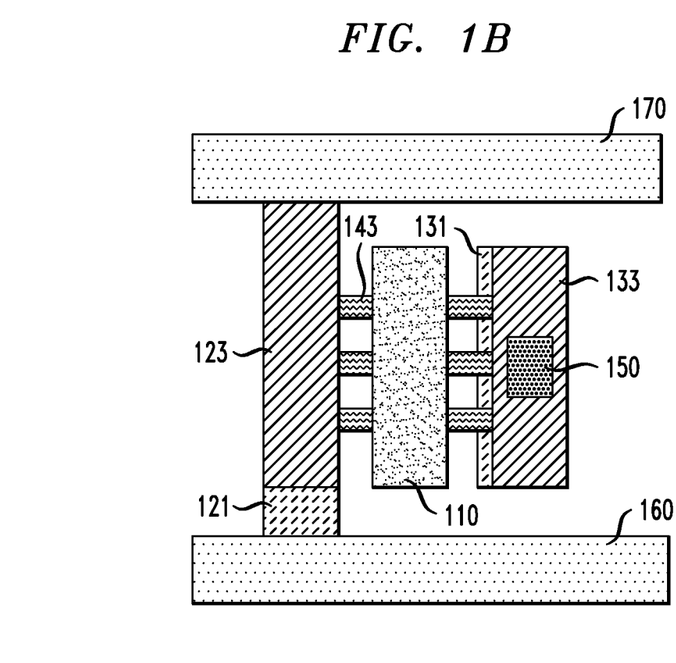

Embodiments of the present invention provide methods and structures for forming stacked complementary FET (CFET) devices that reduce capacitance caused by overlapping structures. Referring to FIGS. 1A and 1B, a stacked CFET device includes a PFET device stacked on an NFET device. The NFET device includes source/drain regions 121 and 131 on opposite sides of fins 141, and the PFET device includes source/drain regions 123 and 133 on opposite sides of fins 143. The source/drain region 121 of the NFET is connected to a ground voltage 160 and the source/drain region 143 is connected to a positive supply voltage (Vdd) 170. The stacked NFET and PFET devices share a gate 110, which wrapped around the fins 141 and 143. A p-n source/drain contact 150 electrically connects the source/drain regions 131 and 133 of the NFET and the PFET.

As can be seen in FIGS. 1A and 1B, there is direct physical overlap between a majority of the elements of the stacked NFET and PFET devices. For example, the fins 141 and 143 can completely overlap each other, and source/drain regions 121 and 131, and 123 and 133 are almost entirely overlapped with each other. As a result, there is high capacitance between p and n-channel regions (e.g., fins), p and n-gate regions, and p and n-source/drain regions.

Embodiments of the present invention reduce overlap of gate, source/drain and channel regions in complementary stacked FETs, and achieve reduced capacitance and, as a result, improve stacked FET device performance. Embodiments of the present invention minimize p-n coupling capacitance, and improve wirability.

For example, in a non-limiting illustrative example of an embodiment of the present invention, p-channel to n-channel capacitance is reduced by 60%, p-source/drain to n-source/drain capacitance is reduced by 95%, and p-gate to n-gate capacitance is reduced by 56% when compared to the overlapping arrangement shown in FIGS. 1A and 1B.

Figure 2A:
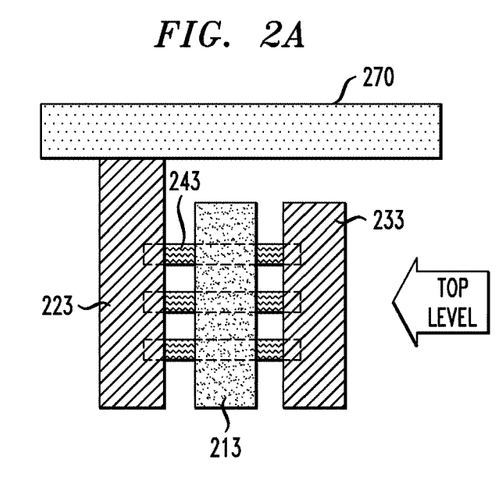
FIGS. 2A, 2B and 2C are top views illustrating levels of a stacked FET device and the stacked FET device, according to an exemplary embodiment of the present invention.
Figure 2B:
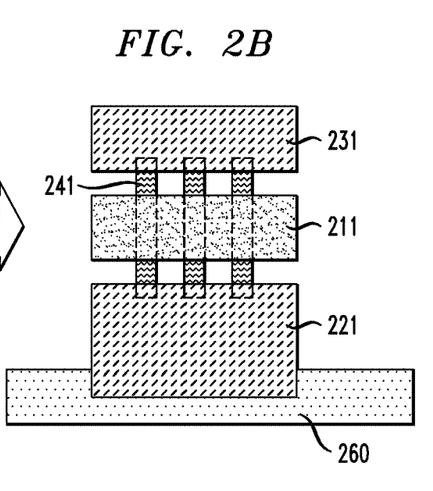
Figure 2C:
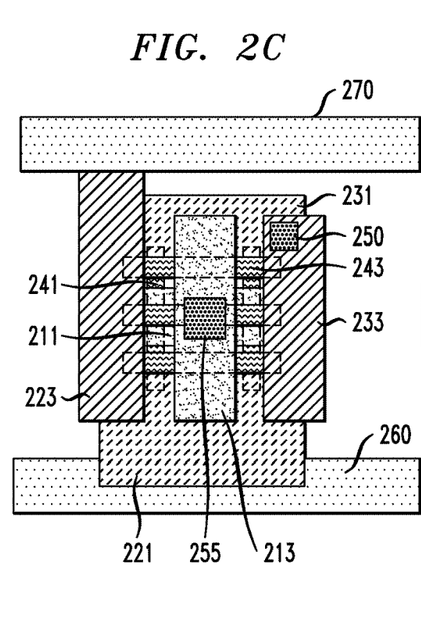

FIGS. 2A, 2B and 2C are top views illustrating levels of a stacked FET device and the stacked FET device, according to an exemplary embodiment of the present invention. Referring to FIGS. 2A, 2B and 2C, a top level of a CFET device includes a PFET having source/drain regions 223 and 233 on left and right sides of fins 243 extending horizontally between the source/drain regions 223 and 233, and a gate region 213 formed around the fins 243. According to an embodiment, the gate region 213 can be in a gate-all-around (GAA) configuration, where the gate region 213 is on all sides of the fins 243. The source/drain region 223 is electrically connected to a power rail 270 comprising, for example, tungsten silicide, copper, cobalt, titanium, and/or tantalum, which can supply, for example, a positive supply voltage (Vdd).

A bottom level of a CFET device includes an NFET having source/drain regions 221 and 231 on bottom and top sides of fins 241 extending vertically between the source/drain regions 221 and 231, and a gate region 211 formed around the fins 241. According to an embodiment, the gate region 211 can be in a GAA configuration, where the gate region 211 is on all sides of the fins 241. The source/drain region 221 is electrically connected to a power rail 260 comprising, for example, tungsten silicide, copper, cobalt, titanium and/or tantalum, which can supply, for example, a ground voltage (GND).

Referring to FIGS. 2A-2C, the top and bottom levels are oriented 90 degrees out-of-phase with respect to each other. In other words, the bottom level FET is rotated 90 or −90° with respect to the orientation of the top level FET, or the top level is rotated 90° or −90° with respect to the orientation of the bottom level FET. The rotation is around the vertical axis in a three-dimensional view, which extends into and out of the page in connection with FIGS. 2A, 2B and 2C. In other words, the rotation axis extends in direction of the stacking of the FETs. As a result, when compared with the orientation, for example, in FIGS. 1A and 1B, the fins 241 and 243, gate regions 211 and 213, and source/drain regions 221 and 231, and 223 and 233 are perpendicular to each other instead of being aligned with each other. As can be seen in FIG. 2C, there is less overlapping area between the fins 241 and 243, and the source/drain regions 221 and 231, and 223 and 233 than the fins and source/drain regions in FIGS. 1A and 1B. In addition, the stacked CFET device in FIG. 2C includes two gate regions 211 and 213 oriented perpendicularly with respect to each other, with less overlapping area than the single gate region 110.

A p-n source/drain contact 250 electrically connects the source/drain regions 231 and 233 of the NFET and the PFET, and a p-n gate contact 255 electrically connects the gate regions 211 and 213 of the NFET and the PFET. As can be seen in FIGS. 2A-2C, the power rails 260 and 270 are oriented parallel to each other.

Fins, such as fins 241 and 243, can be formed by patterning a semiconductor layer into the fins 241 and 243. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited to, oxide or silicon nitride (SiN). After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as hardmasks to form the fins by RIE processes. While embodiments of the present invention describe channel regions as fins, the embodiments are not necessarily limited to fin channel regions, and may include nanowire or nanosheet channel regions. In addition, although three fins are shown in the figures for ease of explanation, more or less than three fins can be formed.

Source/drain regions 221, 223, 231 and 233 can be formed by an epitaxial growth process, wherein the source/drain regions 221, 223, 231 and 233 are grown on the exposed portions of the fins 241 or 243. The epitaxially grown source/drain regions 221, 223, 231 and 233 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1e18/cm^3$ to $3e21/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

According to an embodiment of the present invention, the gate regions 211 and 213 include high-k dielectric layers and gate layers. The high-K dielectric layers include, but are not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other dielectric. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate layers can include, for example, a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layers may further include, but are not necessarily limited to, metals, such as, for example, tungsten, cobalt, zirconium, tantalum, titanium, aluminum, ruthenium, and/or copper, metal carbides, metal nitrides, transition metal aluminides, tantalum carbide, titanium carbide, tantalum magnesium carbide, or combinations thereof deposited on the WFM layer. The gate regions 211 and 213 including the high-k dielectric and gate layers are formed on and around the fins 241 and 243, respectively.

Figure 3A:
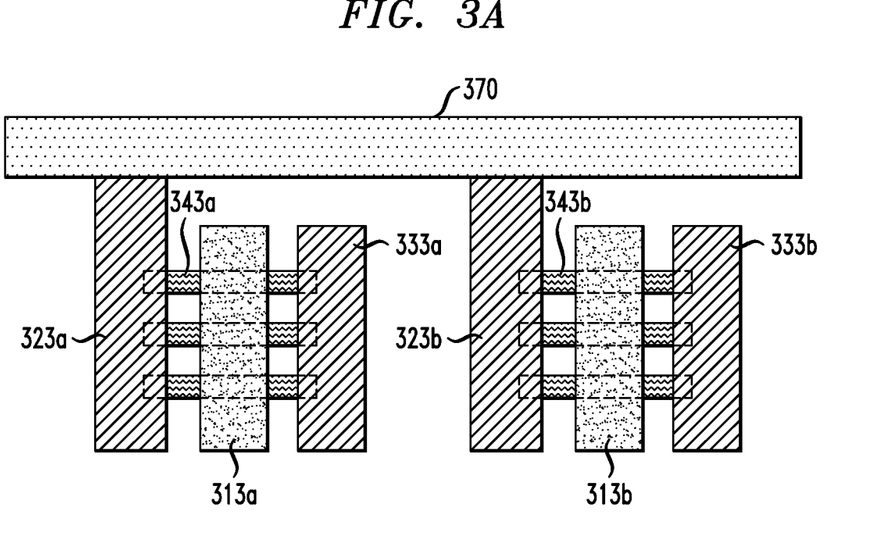
FIGS. 3A and 3B are top views illustrating wirability in a stacked FET device, according to an exemplary embodiment of the present invention.
Figure 3B:
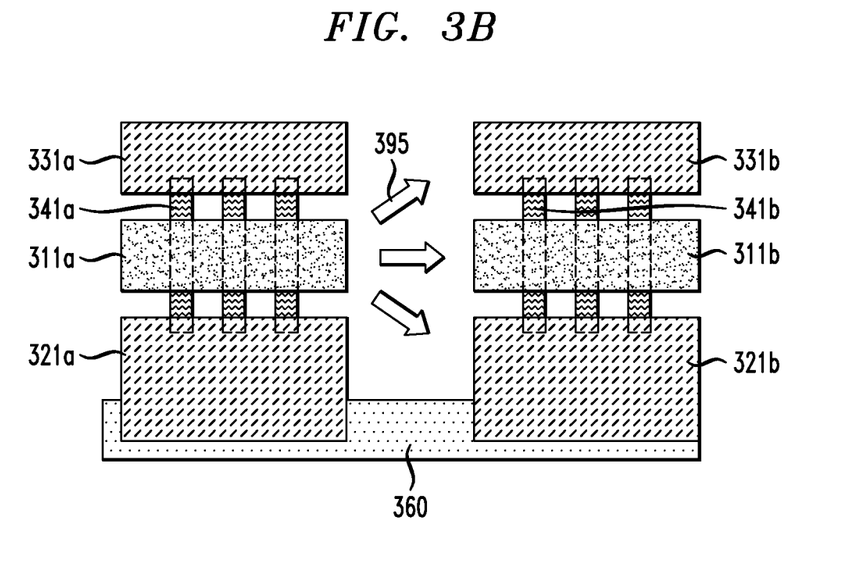

FIGS. 3A and 3B are top views illustrating wirability in a stacked FET device, according to an exemplary embodiment of the present invention. FIGS. 3A and 3B illustrate that it is more difficult to make electrical connections between transistors oriented similar to the PFET in FIG. 2A in the top level than it is to make electrical connections between transistors oriented similar to the NFET in FIG. 2B in the bottom level. Referring to FIG. 3B, wiring connections (as shown by arrows 395) between elements A and B between transistors rotated 90 degrees or −90 degrees in accordance with embodiments of the present invention are easily made in the same level from left to right or right to left since elements are side-by-side in this configuration. For example, left to right or right to left (e.g., horizontal or lateral) connections can be made between source/drain elements 321a and 321b and source/drain elements 331a and 331b, between gate regions 311a and 311b, or between fins 341a and 341b or between other combinations of elements of the left and right transistors.

Referring to FIG. 3A, wiring connections in the same level between elements A and B of transistors oriented in the same manner as the PFET in FIG. 2A are less easily made than the transistors of FIG. 3B. The transistor elements are not side-by-side in the configuration of FIG. 3A. For example, horizontal wiring connections like those shown by arrows 395 are not practical between source/drain elements 323a and 323b and source/drain elements 333a and 333b, between gate regions 313a and 313b, or between fins 343a and 343b or between other combinations of elements of the left and right transistors. Instead, connections between these elements 313a, b, 323a, b, 333a, b and/or 343a, b must be made vertically using, for example, vertical contact vias extending from the elements and between different stacked metallization levels. Accordingly, the rotation of the embodiments of the present invention facilitates wirability between elements of adjacent transistors on the same level. According to an embodiment, adjacent transistors on the same level may have the same or substantially the same height.

Figure 4:
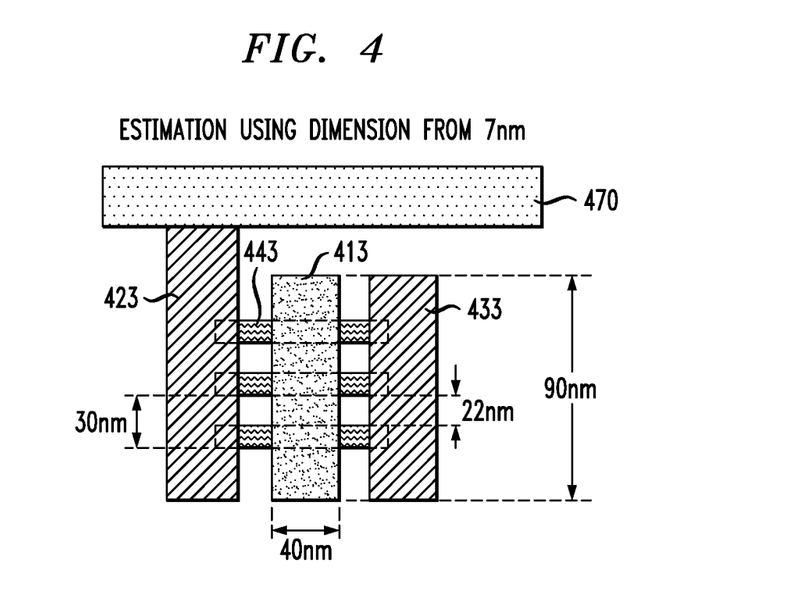
FIG. 4 is a top view illustrating estimated dimensions for a stacked FET device, according to an exemplary embodiment of the present invention.

FIG. 4 is a top view illustrating estimated dimensions for a stacked FET device, according to an exemplary embodiment of the present invention. Referring to FIG. 4, in a non-limiting illustrative example, for 7 nm node, the gate region 413 of the PFET is about 90 nm long and about 40 nm wide, the distance between adjacent fins 443 is about 22 nm and the pitch between fins 443 is about 30 nm. The PFET in FIG. 4 includes source/drain regions 423 and 433 on left and right sides of fins 443 extending horizontally between the source/drain regions 423 and 433, and a gate region 413 formed around the fins 443. The source/drain region 423 is electrically connected to a power rail 470 the same as or similar to power rail 270.

In a non-limiting illustrative example, an NFET device oriented perpendicularly with respect to the PFET device in FIG. 4 (similar to the NFET device in FIG. 2B) can have the same or similar gate region and fin configuration dimensions as the PFET device in FIG. 4, which when oriented in a stacked configuration with the PFET device to form a CFET would achieve the capacitance reductions of 60%, 95% and 56% as noted above.

Figure 5A:
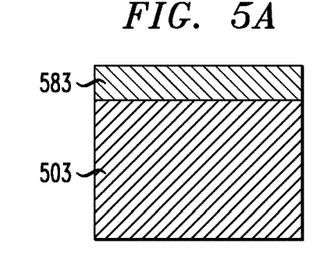
FIGS. 5A, 5B, 5C, 5D and 5E are cross-sectional views illustrating layer transfer, in a method of manufacturing a stacked FET device, according to an exemplary embodiment of the present invention.
Figure 5B:
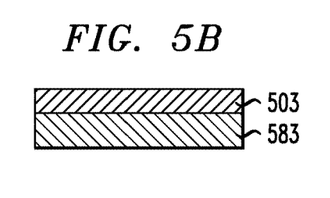
Figure 5C:
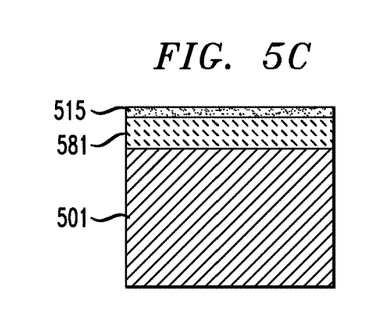

FIGS. 5A, 5B, 5C, 5D and 5E are cross-sectional views illustrating layer transfer, in a method of manufacturing a stacked FET device, according to an exemplary embodiment of the present invention. Referring to FIG. 5A, a PFET 583, for example, like the PFET in FIG. 2A, is formed on a semiconductor substrate 503 (also referred to as a wafer). Referring to FIG. 5C, an NFET 581, for example, like the NFET in FIG. 2B, is formed on a semiconductor substrate 501. Processes for forming the PFET and NFET 583 and 581 include fin, source/drain and gate region formation as described herein, and known in the art. In accordance with an embodiment of the present invention, the substrates or wafers 501 and 503 comprise, a semiconductor material including, but not necessarily limited to, silicon (Si), silicon carbide (SiC), Si:C (carbon doped silicon), II-V, III-V compound semiconductor or other like semiconductor. In addition, multiple layers of the semiconductor materials can be used as the semiconductor material of the substrates 501 and 503. Referring to FIG. 5B, the structure from FIG. 5A is turned upside down so that the PFET 583 is on the bottom, and the substrate 503 is on the top. A height of the substrate 503 is reduced using for example, backside dry or wet etching, and mechanical grinding or polishing. Referring to FIG. 5C, an insulating layer 515 is formed on the NFET 581. The insulating layer 515 can comprise, for example, dielectric materials including, but not necessarily limited to, silicon dioxide and/or silicon nitride, and is deposited using a deposition technique, including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, which can be followed by a planarization process, such as, chemical mechanical planarization (CMP) to remove excess insulating material.

Figure 5D:
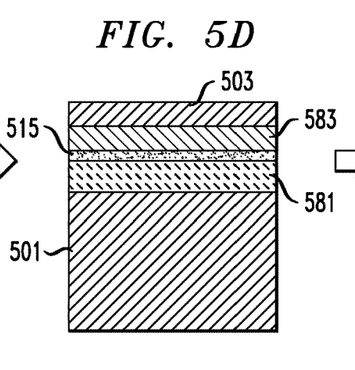
Figure 5E:
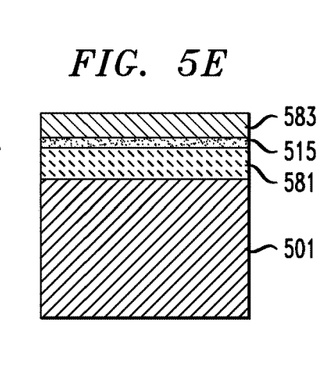

Referring to FIG. 5D, face-to-face (F2F) bonding is performed to bond the structures of FIGS. 5B and 5C together. In accordance with an embodiment of the present invention, the structures of FIGS. 5B and 5C are surface cleaned, prebaked and mechanically bonded to each other by a bonder machine at hundreds of degrees Celsius in mTorr vacuum conditions, followed by a post cure or anneal process. The structures of FIGS. 5B and 5C are bonded together due to Van der Waals forces, as the interface molecules from both sides intertwine with each other. Referring to FIG. 5E, the substrate 503 on the PFET 583 is removed using, for example, further backside dry or wet etching, and mechanical grinding or polishing, to result in the structure including the PFET 583 on the insulating layer 515, which is on the NFET 581 formed on the substrate 501.

Figure 6A:
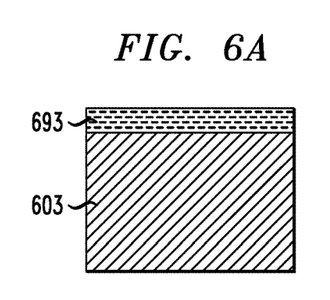
FIGS. 6A, 6B, 6C, 6D, 6E and 6F are cross-sectional views illustrating epitaxial growth and layer transfer, in a method of manufacturing a stacked FET device, according to an exemplary embodiment of the present invention.

FIGS. 6A, 6B, 6C, 6D, 6E and 6F are cross-sectional views illustrating epitaxial growth and layer transfer, in another method of manufacturing a stacked FET device, according to an exemplary embodiment of the present invention. Referring to FIG. 6A, a semiconductor layer 693 is epitaxially grown on a semiconductor substrate 603.

Figure 6B:
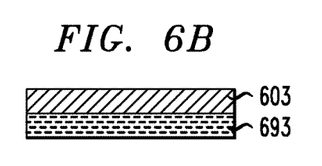
Figure 6C:
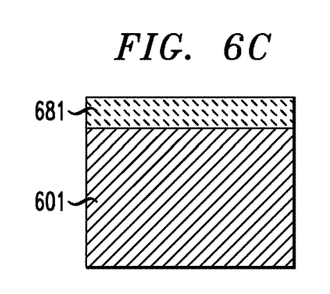

Referring to FIG. 6C, an NFET 681, for example, like the NFET in FIG. 2B, is formed on a semiconductor substrate 601. Processes for forming the NFET 681 include fin, source/drain and gate region formation as described herein, and known in the art. In accordance with an embodiment of the present invention, the substrates or wafers 601 and 603 are the same or similar to the substrates 501 and 503 described herein above. Referring to FIG. 6B, the structure from FIG. 6A is turned upside down so that the epitaxially grown semiconductor layer 693 is on the bottom, and the substrate 603 is on the top. A height of the substrate 603 is reduced like the substrate 503 as described herein above.

Figure 6D:
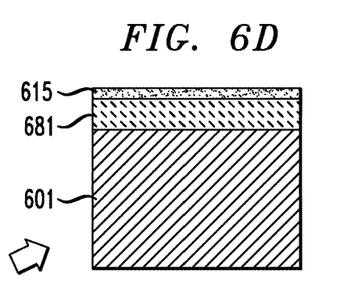

Referring to FIG. 6D, an insulating layer 615, like the insulating layer 515 described herein above, is formed on the NFET 681.

Figure 6E:
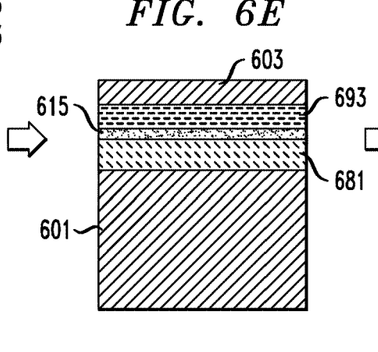
Figure 6F:
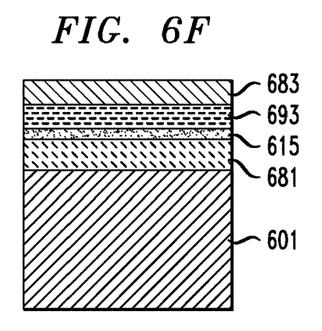

Referring to FIG. 6E, similar to what is described in connection with FIG. 5D, F2F bonding is performed to bond the structures of FIGS. 6B and 6D together. Referring to FIG. 6F, the substrate 603 on the epitaxially grown semiconductor layer 693 is removed using, for example, further backside dry or wet etching, and mechanical grinding or polishing, and a PFET 683, for example, like the PFET in FIG. 2A, is formed on the epitaxially grown semiconductor layer 693. Formation of the PFET 683 on the epitaxially grown semiconductor layer 693 includes epitaxial growth of a p-type region, and fin, gate and source/drain region formation as described herein, and known in the art. In the structure of FIG. 6F, the epitaxially grown semiconductor layer 693 is on the insulating layer 615, which is on the NFET 681 formed on the substrate 601.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first structure comprising a first field-effect transistor (FET) on a first substrate;
   forming a second structure comprising a second FET on a second substrate;
   inverting the second structure so that the second FET is under the second substrate;
   reducing a height of the second substrate;
   adding an insulating layer to the first structure by depositing the insulating layer on the first FET;
   stacking the inverted second structure comprising the second FET under the second substrate on the first structure comprising the insulating layer on the first FET, and the first FET on the substrate;
   wherein the stacking is performed after reducing the height of the second substrate;
   bonding the first structure to the second structure, wherein the insulating layer is positioned between the first and second FETs such that the second FET contacts a top surface of the insulating layer and the first FET contacts a bottom surface the insulating layer;
   performing one of a post cure process and an anneal process on the bonded first and second structures; and
   removing the second substrate from the second structure;
   wherein the first FET is oriented at an angle of ±90 degrees with respect to the second FET;
   wherein the first FET has a first conductivity type and the second FET has a second conductivity type opposite the first conductivity type; and
   wherein the stacked first and second FETs form a complementary FET (CFET) device.
   wherein the first FET is oriented at an angle of ±90 degrees with respect to the second FET.

2. The method according to claim 1, wherein the angle is measured with respect to an axis extending along a direction of the stacking.

3. The method according to claim 1, wherein the first FET comprises an n-type FET (NFET), and the second FET comprises a p-type FET (PFET).

4. The method according to claim 1, wherein the first FET comprises a first plurality of fins extending in a first direction, and the second FET comprises a second plurality of fins extending in a second direction perpendicular to the first direction.

5. The method according to claim 4, wherein:
   the first plurality of fins extends between a first pair of source/drain regions; and
   the second plurality of fins extends between a second pair of source/drain regions.

6. The method according to claim 5, wherein the first and second pair of source/drain regions are oriented perpendicularly with respect to each other.

7. The method according to claim 5, further comprising forming a contact between at least one source/drain region of the first pair of source/drain regions and at least one source/drain region of the second pair of source/drain regions.

8. The method according to claim 1, wherein the first FET comprises a first gate region extending in a first direction, and the second FET comprises a second gate region extending in a second direction perpendicular to the first direction.

9. The method according to claim 8, further comprising forming a contact between the first and second gate regions.

10. The method according to claim 1, wherein the first FET is connected to a ground voltage (GND).

11. The method according to claim 10, wherein the second FET is connected to a positive supply voltage (Vdd).

12. The method according to claim 1, further comprising forming a third FET adjacent the first FET at a same level as the first FET, wherein at least one element of the first FET is electrically connected to at least one element of the third FET through a wire on the same level between the at least one element of the first FET and the at least one element of the third FET.

13. The method according to claim 12, wherein the wire extends laterally between the at least one element of the first FET and the at least one element of the third FET.

14. The method according to claim 5, wherein the first and second pair of source/drain regions overlap each other in part.

15. A method for manufacturing a semiconductor device, comprising:
   forming a first structure comprising a first field-effect transistor (FET) on a first substrate, the first FET comprising a first plurality of channel regions extending in a first direction;
   forming a second structure comprising a second FET on a second substrate, the second FET comprising a second plurality of channel regions extending in a second direction perpendicular to the first direction;
   inverting the second structure so that the second FET is under the second substrate;
   reducing a height of the second substrate;
   adding an insulating layer to the first structure by depositing the insulating layer on the first FET;
   stacking the inverted second structure comprising the second FET under the second substrate on the first structure comprising the insulating layer on the first FET, and the first FET on the first substrate;
   wherein the stacking is performed after reducing the height of the second substrate;
   bonding the first structure to the second structure, wherein the insulating layer is positioned between the first and second FETs such that the second FET contacts a top surface of the insulating layer and the first FET contacts a bottom surface the insulating layer;

performing one of a post cure process and an anneal process on the bonded first and second structures; and removing the second substrate from the second structure;

wherein the first FET comprises a first gate region extending in the second direction across the first plurality of channel regions, and the second FET comprises a second gate region extending in the first direction across the second plurality of channel regions;

wherein the first FET has a first conductivity type and the second FET has a second conductivity type opposite the first conductivity type; and wherein the stacked first and second FETs form a complementary FET (CFET) device.

16. The method according to claim 15, wherein:

the first plurality of channel regions extends between a first pair of source/drain regions; and the second plurality of channel regions extends between a second pair of source/drain regions.

17. The method according to claim 16, wherein the first and second pair of source/drain regions are oriented perpendicularly with respect to each other.

18. The method according to claim 17, wherein the first and second pair of source/drain regions overlap each other in part.

* * * * *